US011881861B2

(12) United States Patent
Manjunath et al.

(10) Patent No.: US 11,881,861 B2
(45) Date of Patent: Jan. 23, 2024

(54) TECHNIQUES TO REDUCE THE EFFECT OF PAD ASYMMETRY AND SIGNAL ROUTING ON RESOLUTION OF PWM OR PFM SIGNALS

(71) Applicant: Infineon Technologies AG, Neubiberg (DE)

(72) Inventors: Sunanda Manjunath, Munich (DE); Ketan Dewan, Unterhaching (DE); Juergen Schaefer, Oberhaching (DE)

(73) Assignee: Infineon Technologies AG, Neubiberg (DE)

( * ) Notice: Subject to any disclaimer, the term of this patent is extended or adjusted under 35 U.S.C. 154(b) by 184 days.

(21) Appl. No.: 17/584,836

(22) Filed: Jan. 26, 2022

(65) Prior Publication Data

US 2023/0238949 A1    Jul. 27, 2023

(51) Int. Cl.
*H03K 5/1534* (2006.01)
*H03K 5/08* (2006.01)
*H03K 7/08* (2006.01)
*H03K 19/17736* (2020.01)
*H03K 5/05* (2006.01)
*H03K 5/00* (2006.01)

(52) U.S. Cl.
CPC ............ *H03K 5/1534* (2013.01); *H03K 5/05* (2013.01); *H03K 5/086* (2013.01); *H03K 7/08* (2013.01); *H03K 19/17744* (2013.01); *H03K 2005/00136* (2013.01)

(58) Field of Classification Search
CPC ........ H03K 5/1534; H03K 5/05; H03K 5/086; H03K 7/08; H03K 19/17744; H03K 2005/00136
See application file for complete search history.

(56) References Cited

U.S. PATENT DOCUMENTS

2016/0036328 A1\* 2/2016 Noh .................... H02M 3/1588
                                                      323/271
2018/0219484 A1\* 8/2018 Mercer ................. H02M 3/158

OTHER PUBLICATIONS

Abdel-Rahman, Sam. "Resonant LLC Converter: Operation and Design" Published Sep. 2012.
Texas Instruments. "Phase-Shifted Full Bridge DC/DC Power Converter Design Guide" Published May 2014.

\* cited by examiner

*Primary Examiner* — Jeffrey M Shin
(74) *Attorney, Agent, or Firm* — Eschweiler & Potashnik, LLC (57) ABSTRACT

Some examples relate to a system including a pulse modulation (PM) circuit having a PM input and a PM output. The system also includes a load circuit having a load circuit input, and an I/O pad coupling the PM output to the load circuit input. An asymmetry detection circuit has a first asymmetry detection (AD) input coupled to the PM output via a first feedback path, a second AD input coupled to an output node of the I/O pad via a second feedback path, and an AD output coupled to the PM input of the pulse modulation circuit via a control path.

20 Claims, 7 Drawing Sheets

TECHNIQUES TO REDUCE THE EFFECT OF PAD ASYMMETRY AND SIGNAL ROUTING ON RESOLUTION OF PWM OR PFM SIGNALS

FIELD

The present disclosure relates in general to electronic systems that are driven by a modulated signal, such as a pulse-width-modulated (PWM) signal or pulse-frequency-modulated (PFM) signal.

BACKGROUND

Many applications, such as motor control and power conversion for example, make use of pulse width modulation (PWM) or pulse frequency modulation (PFM) control techniques to drive a circuit. Whereas a typical clock signal has a duty cycle of 50% (e.g., meaning the clock signal is high for 50% of its clock period, and is low for the other 50% of its clock period), PWM changes the duty cycle to control an output of the circuit.

DETAILED DESCRIPTION

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware.

Figure 1A:
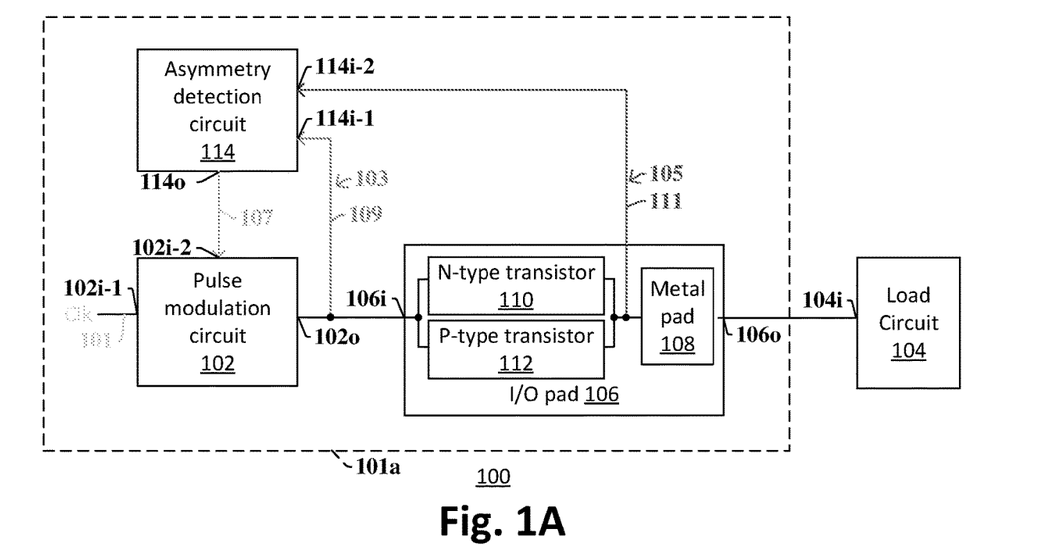
FIG. 1A illustrates a pulse modulation system in accordance with some embodiments.

FIG. 1A includes a system 100 in accordance with some embodiments. The system 100 includes a pulse modulation circuit 102, a load circuit 104, and an Input/Output (I/O) pad 106. The I/O pad 106 includes a metal pad 108, such as a bond pad, solder ball, solder bump, or other pad structure. The I/O pad 106 includes an n-type transistor 110 and a p-type transistor 112, which are coupled to the metal pad 108 and which define an input node 106$i$ of the I/O pad 106. An output node 106$o$ of the I/O pad 106, which corresponds to the metal pad 108, is coupled to the input 104$i$ of the load circuit 104. Thus, the I/O pad 106 couples a PM output 102$o$ to an input 104$i$ of the load circuit 104.

During operation, the pulse modulation circuit 102 receives a clock signal 101 on a clock input 102$i$-1 and provides a PWM signal 103 based on the clock signal 101 to the I/O pad 106. The I/O pad 106 in turn provides a modified PWM signal 105 to the load circuit 104 based on the PWM signal 103. In an ideal case, the modified PWM signal 105 would be identical to the PWM signal 103. However, as has been appreciated in some aspects of the present disclosure, due to the presence of the I/O pad 106 and/or differences in routing/wiring paths between the pulse modulation circuit 102 and load circuit 104, the modified PWM signal 105 may have rising edges and/or falling edges that are undesirably shifted relative to the corresponding edges of the PWM signal 103. For example, in some cases the pull up time for the p-type transistor 112 may be slightly less than the pull-down time of the n-type transistor 110 (or vice versa), thereby undesirably changing the duty cycle, alignment of rising and/or falling edges, rise-time slopes, and/or fall-time slopes of the modified PWM signal 105 compared to the PWM signal 103 (and/or of those characteristics of the PWM signal itself and/or modified PWM signal itself). For example, if the PWM signal 103 has a fall time of 10 pico-seconds (ps), then remains low for 5 nanoseconds (ns), then has a rise time of 50 ps, then remains high for 5 ns for each clock cycle; there is an asymmetry between the rise time and fall time of the PWM signal 103 (e.g., due to differences in pull-up and pull-down times of n-type and p-type transistors—which can be due to sizing, doping, etc., of these transistors). This asymmetry, and/or asymmetries within rise times (or fall times) of the modified PWM signal 105, and/or asymmetries between the PWM signal 103 and modified PWM signal 105 can cause the load circuit 104 to operate out of specification or operate less accurately than optimal, thereby effectively reducing the effective resolution of the pulse modulation circuit.

Accordingly, to compensate for such asymmetries, the system 100 includes an asymmetry detection circuit 114. The asymmetry detection circuit 114 includes a first asymmetry detection (AD) input 114$i$-1 coupled to PM output 102$o$ via a first feedback path 109, and a second AD input 114$i$-2 coupled to the metal pad 108 and/or output node 106$o$ of the I/O pad 106 via a second feedback path 111. The asymmetry detection circuit 114 also includes an AD output 114$o$ coupled to a second input 102$i$-2 of the pulse modulation circuit 102. The asymmetry detection circuit 114 detects the asymmetry between the rising and falling edges of the PWM signal 103 and modified PWM signal 105, and provides a control signal on control path 107 to alter the PWM signal 103 to induce symmetry in the modified PWM signal 105. Thus, the asymmetry detection circuit 114 is arranged to establish a closed feedback loop that includes the pulse modulation circuit 102 and the I/O pad 106. In this regard, the asymmetry detection circuit 114 provides on-going control to keep the slopes and/or timing of the rising and falling edges of the modified PWM signal 105 symmetric with respect to the slopes and/or timing of the corresponding rising and falling edges of the PWM signal 103. Thus, because of this symmetry, the load circuit 104 can be controlled with a higher resolution PWM signal than with a system without the asymmetry detection circuit 114. In this regard, the system of FIG. 1A can be used in a wide variety of applications where a load circuit is driven by a PWM signal and/or a pulse frequency modulated (PFM) signal, including power converter circuits such as DC-to-DC converters or DC-to-AC converters; power control circuits such as engine control circuits; industrial or residential electronics, such as lighting controls; and/or communication systems; among others.

Figure 2:
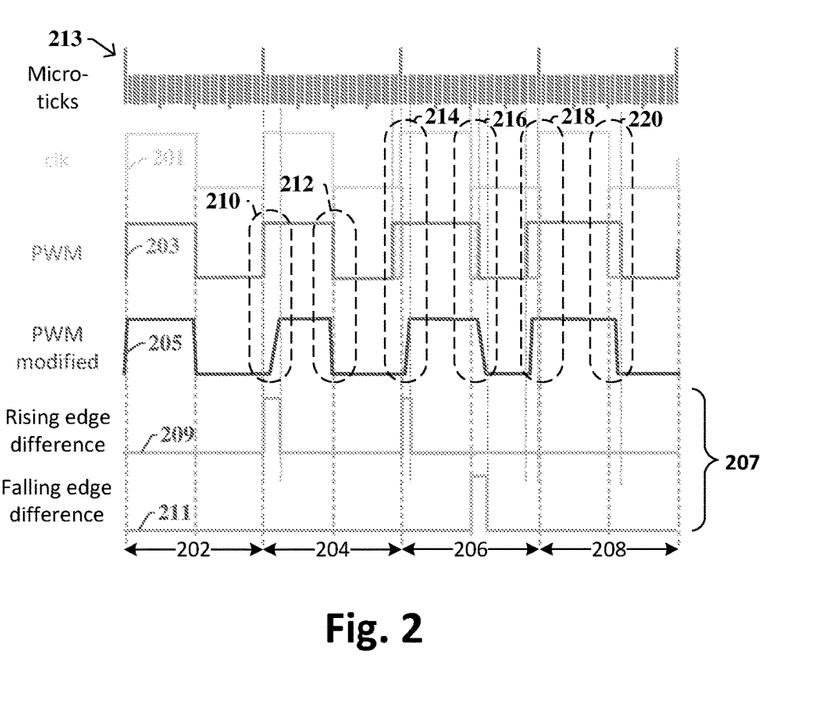
FIG. 2 illustrates some sample waveforms in accordance with some implementations consistent with FIG. 1A.

FIG. 2 illustrates some waveforms consistent with some examples of FIG. 1A. In particular, FIG. 2 illustrates a clock signal 201 (e.g., consistent with some examples of clock signal 101 in FIG. 1A), a PWM signal 203 (e.g., consistent with some examples of PWM signal 103 in FIG. 1A), a modified PWM signal 205 (e.g., consistent with some examples of modified PWM signal 105 in FIG. 1A), and a control signal 207 (e.g., consistent with some examples of control signal 107 in FIG. 1A). In FIG. 2, the control signal 207 includes a rising edge difference signal 209 and a falling edge difference signal 211. The system can also include an underlying clock signal, illustrated as a series of micro-ticks 213, which has a frequency that is higher than that of the clock signal 201.

Referring briefly to FIG. 1A and FIG. 2 concurrently, in some implementations the pulse modulation circuit 102 is configured to provide the PWM signal 203 to the I/O pad 106. The output node 106o of the I/O pad 106, in turn, is configured to provide the modified PWM signal 205 to the input 104i of the load circuit 104. The modified PWM signal 205 is based on the PWM signal 203 but has a rise and/or fall time shift, rise and/or fall time slope difference, and/or other asymmetry relative to a corresponding rising edge of the PWM signal 203. The asymmetry detection circuit 114 is configured to provide the control signal 207 based on this asymmetry. The pulse modulation circuit 102 can then adjust a subsequent cycle of the PWM signal 203 based on the control signal 207 to limit the asymmetry for subsequent cycle(s) of the PWM signal 203. This subsequent cycle when the correction occurs may the immediate next cycle in some cases, but more often the correction takes more than one cycle and/or is an on-going process.

For example, during the first clock period 202, the PWM signal 203 and modified PWM signal 205 have a rising edge and a falling edge that are aligned. Thus, the rising edge difference signal 209 and falling edge difference signal 211 remain constant (e.g., zero) throughout the first clock period 202, and the modified PWM signal 205 is symmetric with respect to the clock signal 201 and PWM signal 203. In other examples, the modified PWM signal 205 could have rising and falling edges that are each delayed by the same amount relative to the PWM signal 203 (e.g., due to registering or other synchronous delays), but because the duty cycle of the modified PWM signal 205 in such a case is still the same as that of the PWM signal 203, the modified PWM signal 205 can still be considered to have rising and falling edges that are symmetric.

In the second clock period 204, however, the rising edge of the modified PWM signal 205 has a rising edge that is delayed relative to the rising edge of the PWM signal (see 210), while the falling edge of the modified PWM signal 205 is still aligned with the falling edge of the PWM signal (see 212). For instance, in the illustrated example, the modified PWM signal 205 for the second clock period 204 has a rising edge that is delayed by four micro-ticks relative to that of the PWM signal 203 (see 210), while the falling edge of the modified PWM signal 205 is still aligned to the PWM signal 203 (see 212). Thus, this asymmetry could occur, for example, if the p-type transistor 112 pulls-up slower than the n-type transistor 110 pulls-down, or if other asymmetries, such as differences in routing, are present in the I/O pad 106. Whatever the cause, this asymmetry is reflected by the control signal 207, which is provided to the pulse modulation circuit 102. Consequently, in the third clock period 206, the pulse modulation circuit 102 adjusts the PWM signal 203 based on the rising edge difference to "tune" the PWM signal to account for this asymmetry. More particularly, in the third clock period 206, the pulse modulation circuit 102 time shifts the PWM signal 203 so a rising edge of the PWM signal 203 is two micro-ticks earlier than a corresponding rising edge of the clock signal 201 (see 214) and has a falling edge that is time shifted to be two micro-ticks later than a corresponding falling edge of the clock signal 201 (see 216).

Further in the third clock period 206, the rising edge of the modified PWM signal 205 now has a rising edge that is delayed relative to the rising edge of the PWM signal 203 by four micro-ticks (see 214), and the falling edge of the modified PWM signal 205 is also delayed relative to the falling edge of the PWM signal 203 by two micro-ticks (see 216)—so again, some asymmetry remains in the modified PWM signal 205. This asymmetry is reflected by the rising edge difference signal 209 and falling edge difference signal 211 for the third clock period 206, which are again provided to the pulse modulation circuit 102.

Consequently, in the fourth clock period 208, the pulse modulation circuit 102 re-adjusts the PWM signal 203 based on the rising edge difference signal 209 and falling edge difference signal 211 for the third clock period 206 to "re-tune" the PWM signal 205 to account for this asymmetry. For example, in the illustrated example, in the fourth clock period 208 the PWM signal 203 has a rising edge that is time shifted to be three micro-ticks earlier than a corresponding rising edge of the clock signal (see 218) and has a falling edge that is time shifted to be three micro-ticks later than a corresponding falling edge of the clock signal (see 220). In the fourth clock period 208, this results in the modified PWM signal 205 being symmetric with regards to the clock signal 201 and the PWM signal 203 (see 218 and 220), thereby providing a symmetric modified PWM signal to the load circuit, which promotes favorable operation of the load circuit 104.

Although FIG. 2 has been described above with regards to an example where signal asymmetry manifests as a time-shift difference between the PWM signal 203 and the modified PWM signal 205, in other examples an asymmetry between a rising edge slope of the PWM signal 203 and a falling edge slope of the PWM signal 203 can be detected and corrected. In further examples, the system can detect and correct an asymmetry between a rising edge slope of the modified PWM signal 205 and a falling edge slope of the modified PWM signal 205.

Although FIG. 1A and FIG. 2 have been illustrated and described with regards to a PWM signal, it will be appreciated the present disclosure is also applicable to pulse frequency modulated (PFM) signals. Pulse frequency modulation (PFM) is analogous to PWM. In PFM, the frequency of the pulse train is varied in accordance with the instantaneous amplitude of the modulating signal at sampling intervals, while the amplitude and width/duty cycle of the pulses is kept constant.

Figure 1B:
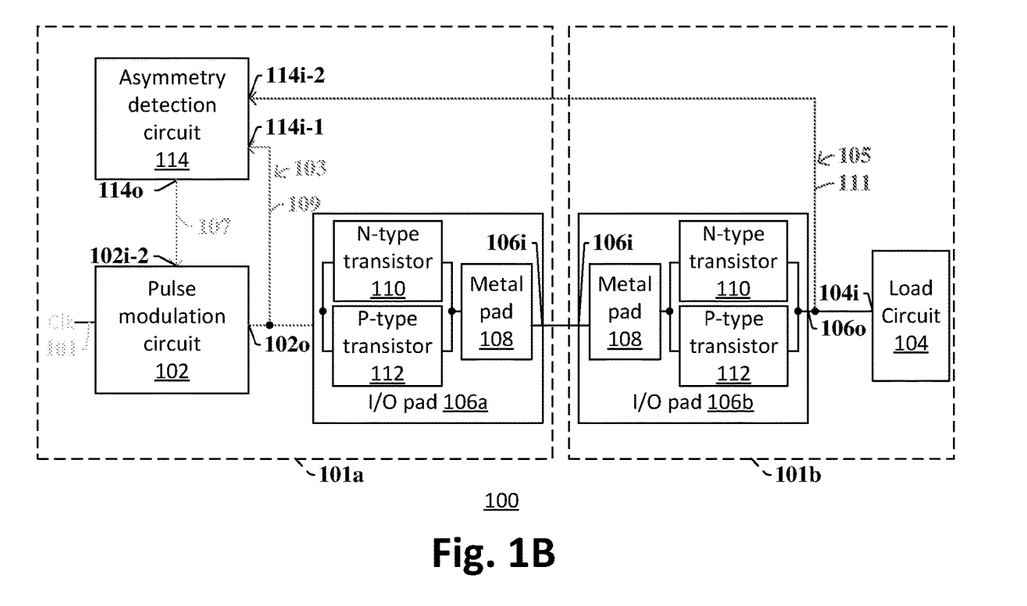
FIG. 1B illustrates a pulse modulation system in accordance with some embodiments.

Further, it will be appreciated that some embodiments of FIG. 1A can be implemented such that the pulse modulation circuit 102, the I/O pad 106, and the asymmetry detection circuit 114 are included as part of a single integrated circuit 101a, and the asymmetry detection circuit 114 accounts solely for on-chip timing aberrations for this integrated circuit. In other embodiments, however, such as shown in FIG. 1B, the asymmetry detection circuit 114 can also account for timing aberrations of I/O pads included on another die or integrated circuit. Accordingly, FIG. 1B shows an alternative embodiment where a first I/O pad 106a is included on a first integrated circuit 101a, and a second I/O pad 106b is included on a second integrated circuit 101b corresponding to the load circuit 104. Thus, in FIG. 1B, the asymmetry detection circuit 114 accounts for timing aberrations such as PWM asymmetry for the first I/O pad 106a and the second I/O pad 106b to provide a high resolution PWM signal to the load circuit 104. Of course, in FIG. 1B, the routing of the second feedback path 111 may also include additional I/O pads (not shown). In still other embodiments, the system 100 may be divided among additional integrated circuits aside from what is illustrated, and/or can manifest as a single three-dimensional IC where multiple die are stacked in a single package.

Figure 3:
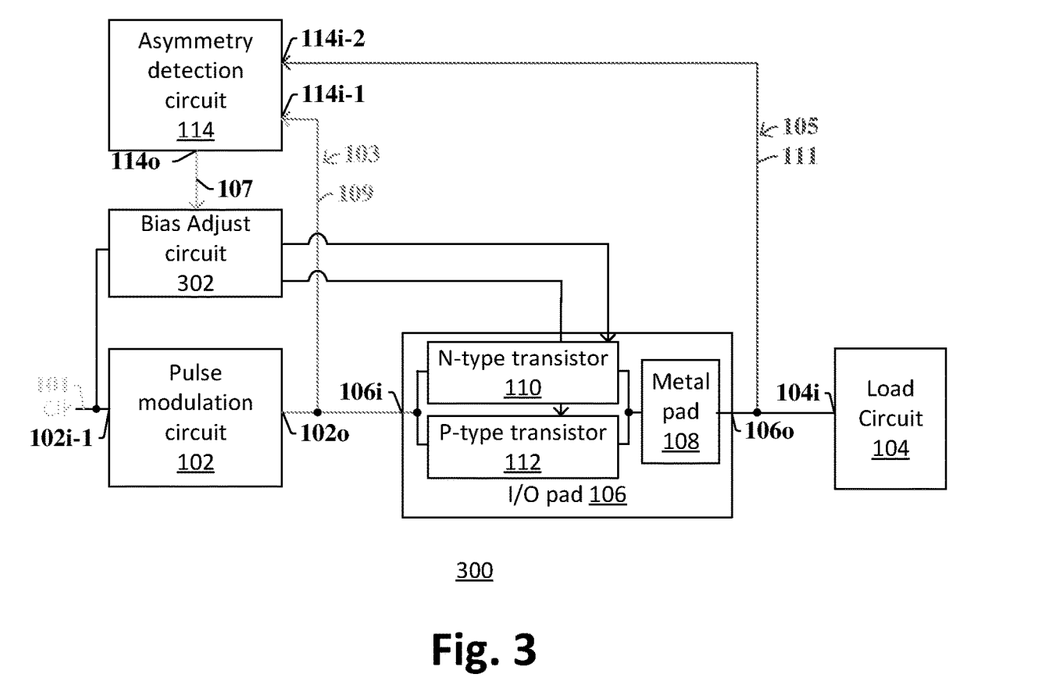
FIG. 3 illustrates a pulse modulation system in accordance with some embodiments.

FIG. 3 illustrates another system 300 in accordance with some embodiments. Like system 100, system 300 includes a pulse modulation circuit 102, a load circuit 104, and an I/O pad 106. The I/O pad 106 couples a PM output 102o of the pulse modulation circuit 102 to an input 104i of the load circuit 104, and may induce some asymmetry as the PWM signal 103 is received and converted to a modified PWM signal 105 that is provided to the load circuit 104. However, rather than providing the control signal 107 to the pulse modulation circuit 102 as in FIG. 1, the system 300 provides the control signal 107 to a bias adjust circuit 302. This bias adjust circuit 302 adjusts a voltage and/or current bias provided to the n-type transistor 110 and/or p-type transistor 112 to correct for asymmetry in the modified PWM signal 105. Thus, the bias adjust circuit 302 can independently bias/adjust the N-type transistor 110 and P-type transistor 112 in time as appropriate to induce symmetry into the modified PWM signal 105.

For example, if the rising edge of the modified PWM signal 105 is time shifted to be late relative to the corresponding rising edge of the PWM signal 103 (e.g., suggesting the p-type transistor 112 is slow to pull up), the bias adjust circuit 302 can provide a larger bias to the p-type transistor 112 to help correct this asymmetry. Thus, the bias adjust circuit 302 can provide a larger supply voltage at a source terminal of the p-type transistor 112, or can otherwise bias the p-type transistor 112 by altering the source/drain bias, gate/source bias, body bias, etc., to provide a faster pull up. For instance, if the gate voltage of the p-type transistor 112 was previously driven at a magnitude of 1.2 V but was slow to pull up, the bias adjust circuit 302 can overdrive the gate voltage at a magnitude of 1.4 V to promote faster pull up, wherein the change in magnitude is based on the amount of time shift indicated in the control signal 107. In contrast, if the rising edge of the modified PWM signal 105 is early, the bias can be decreased for the p-type transistor 112 to slow the pull-up at for rising edge. Analogously, if the falling edge of the modified PWM signal 105 is time shifted to be late (or early) relative to the corresponding falling edge of the PWM signal 103 (e.g., suggesting the n-type transistor 110 is slow to pull down), the bias adjust circuit 302 can provide a larger bias (or smaller bias) to the n-type transistor 110 to help correct this asymmetry. Thus, the bias adjust circuit 302 can change the bias conditions applied to the control terminals of the p-type transistor 112 and/or n-type transistor 110 based on the control signal 107 to help keep symmetry in the modified PWM signal 105.

Several additional examples are provided below. These examples are illustrated and described with regards to an asymmetry detection circuit similar to that of FIG. 1, but it will be appreciated that these examples could equivalently be implemented with regards to a bias adjust circuit similar to that of FIG. 3.

Figure 4:
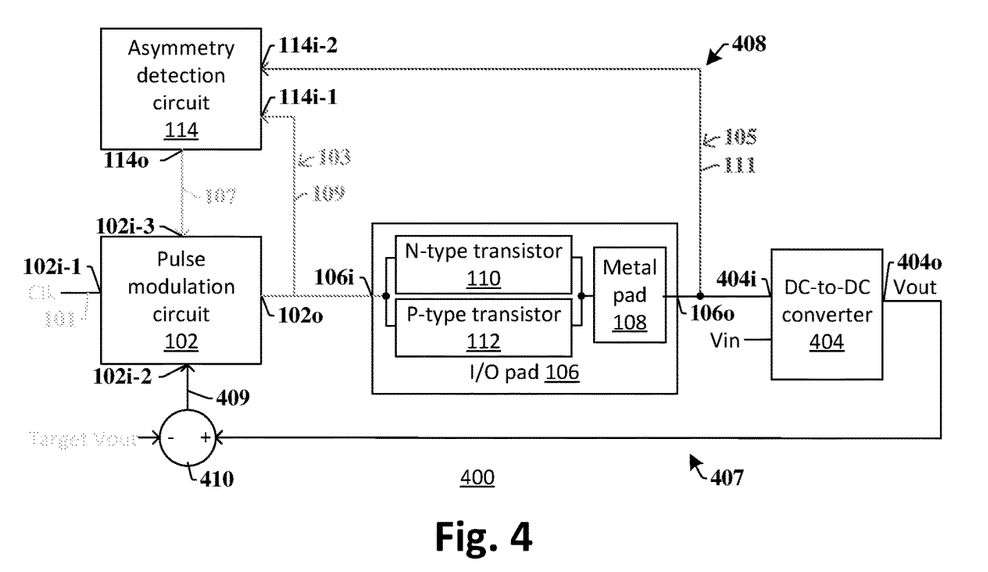
FIG. 4 illustrates a more detailed DC-to-DC converter system in accordance with some embodiments.

FIG. 4 includes a DC-to-DC converter system 400 in accordance with some embodiments. The DC-to-DC converter system 400 includes a pulse modulation circuit 102, and an I/O pad 106 coupling the PM output 102o of the pulse modulation circuit 102 to an input 404i of a DC-to-DC converter 404. The DC-to-DC converter 404 can be a full-bridge switching DC-to-DC converter or a half-bridge DC-to-DC converter, for example; and includes a number of switching transistors that are driven by the modified PWM signal 105 to convert a voltage input (Vin) to a voltage output (Vout) that differs from Vin. Typically, changing the duty cycle of the modified PWM signal 105 controls the steady-state of the output voltage (Vout) with respect to the input voltage (Vin). Thus, depending on the modified PWM signal 105 and circuitry within the DC-to-DC converter 404, the DC-to-DC converter 404 can be a buck converter or step down converter (e.g., Vout<Vin), a boost converter or step-up converter (e.g., Vout>Vin), and/or a buck-boost converter where Vout is greater than Vin at some times and less than Vin at other times.

To carefully control the duty cycle of the modified PWM signal 105, the DC-to-DC converter system 400 includes a first feedback path 407 and a second feedback path 408. The first feedback path 407 couples an output 404o of the DC-to-DC converter to a second input 102i-2 of the pulse modulation circuit 102. A comparator 410 on the first feedback path 407 monitors the output voltage of the DC-to-DC converter and compares it to a target voltage (Target Vout), which can be an analog or digital signal. An error signal 409 is generated based on this comparison and is provided to the pulse modulation circuit 102 so the pulse modulation circuit 102 can change the PWM signal 103 (and consequently the modified PWM signal 105) based on the error signal 409 to control the output voltage provided by the DC-to-DC converter 404.

The second feedback path 408 couples the output node 106o of the I/O pad 106 to the second (AD) input 114i-2 of the asymmetry detection circuit 114. The asymmetry detection circuit 114 generates a control signal 107 based on whether the modified PWM signal 105 is asymmetric with regards to the PWM signal 103, for example, as described above in FIGS. 1-2. Thus, the pulse modulation circuit 102 of FIG. 4 updates the PWM signal 103 based on both the error signal 409 and the control signal 107 to provide for highly controlled and accurate switching of the DC-to-DC converter 404.

Figure 5A:
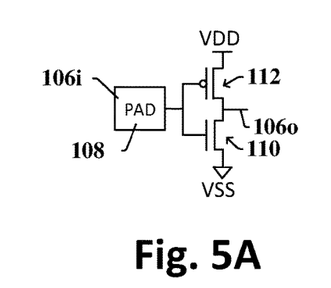
FIGS. 5A-5C illustrate some sample I/O pads in accordance with some embodiments.
Figure 5B:
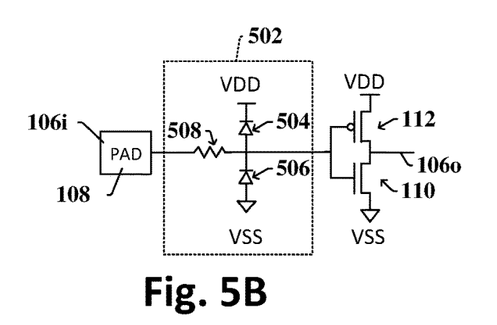
Figure 5C:
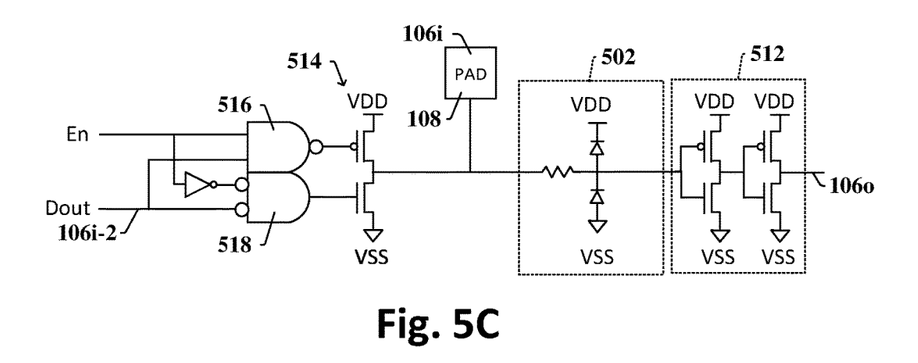

FIGS. 5A-5C illustrate some non-limiting examples of I/O pads, and any of these and/or other I/O pads can be included in the circuits and/or systems described herein. In FIGS. 5A-5C, each I/O pad 106 includes a metal pad 108, such as a bond pad, solder ball, solder bump, or other pad structure; and an n-type transistor 110 and a p-type transistor 112 that are coupled to the metal pad 108. Further, in the illustrated examples of FIGS. 5A-5C, the transistors are illustrated and described as metal oxide semiconductor field effect transistors (MOSFETs), but in other embodiments, the transistors could be other types of transistors, such as bipolar junction transistors (BJTs), insulated-gate bi-polar transistors (IGBTs), finFETs, or junction field effect transistors (JFETs), among others.

In FIG. 5A, the p-type transistor 112 has a gate coupled to the metal pad 108, a source coupled to VDD, and a drain coupled to the output node 106o. The n-type transistor 110 has a gate coupled to the metal pad 108, a drain coupled to VSS, and a source coupled to the output node 106o. Thus, the p-type transistor 112 and n-type transistor 110 establish an inverter whose input is coupled to the metal pad 108, and whose output is coupled to the output node 106o.

In FIG. 5B, the I/O pad again includes a p-type transistor 112 and n-type transistor 110 configured as an inverter, and also includes an electrostatic discharge (ESD) protection circuit 502 arranged between the metal pad 108 and the input of the inverter. In this example, the ESD protection circuit 502 includes a pull-up diode clamp 504, a pull-down diode clamp 506, as well as a current limiting resistor 508, which are operably coupled as shown.

In FIG. 5C, the I/O pad is a bidirectional pad, wherein the metal pad 108 has an output node 106o to drive a load circuit, as well as an input that is driven by the load circuit. Thus, the metal pad 108 again includes an ESD protection circuit 502 and in this case first and second inverters 512 that are arranged in series to drive the output node 106O. The metal pad 108 is also coupled to an inverter 514 that is selectively enabled by logic gates (e.g., NAND gate 516 and AND gate 518) and an enable signal (En). So long as the enable signal is low (e.g., logical 0), the input from the load circuit is disabled, so the metal pad 108 will float and/or be driven solely by the input 106i. When the enable signal is driven high, however, the output of the NAND gate 516 will track the Dout signal (so if Dout is 1, then the metal pad 108 is driven to a logical 1, but if Dout is 0, then the metal pad 108 is driven to logical 0). Of course, FIGS. 5A-5C are but a few examples of how an I/O pad can be implemented, and do not limit the scope of this disclosure.

Figure 6:
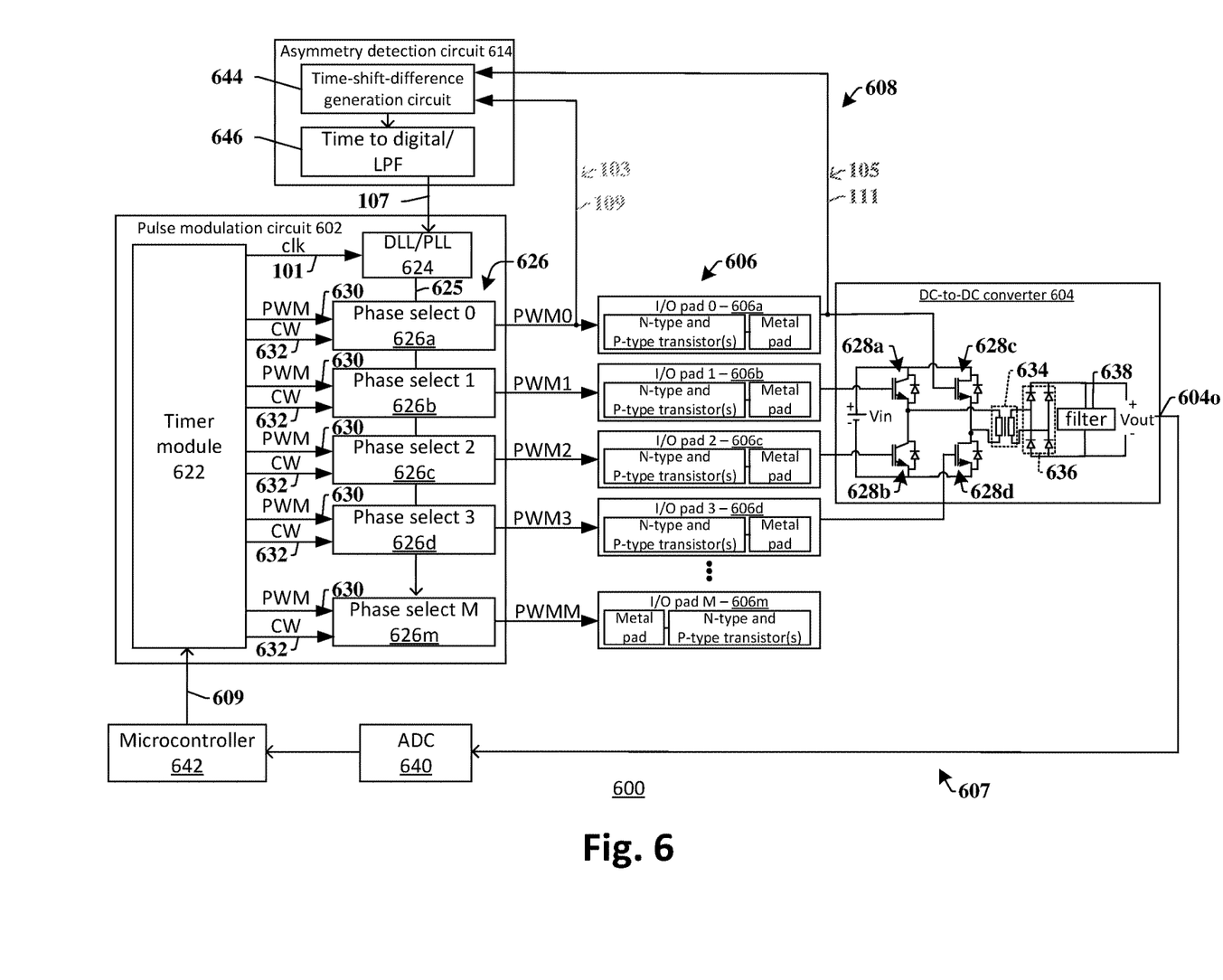
FIG. 6 illustrates a more detailed DC-to-DC converter system in accordance with some embodiments.

FIG. 6 illustrates a more detailed example of a DC-to-DC converter system 600 in accordance with some embodiments. The DC-to-DC converter system 600 includes a pulse modulation circuit 602, a plurality of I/O pads 606, a DC-to-DC converter 604, and an asymmetry detection circuit 614.

In the illustrated example, the pulse modulation circuit 602 includes a timer module 622, a digital-locked-loop/phase-locked-loop (DLL/PLL) 624, and M output phase selection circuits 626a-626m. In general, M can be any integer, but in some example implementations M=24. The timer module 622 provides a base PWM signal 630 to each of the phase selection circuits 626 and an N-bit control word 632 to each of the phase selection circuits 626. The timer module 622 also provides the clock signal 101 to the DLL/PLL 624. The DLL/PLL 624 can provide a different phase signal 625 to the phase selection circuits 626 to set the PWM signals (PWM0-PWMM) driven by the phase selection circuits 626. The base PWM signal 630 can have a resolution on the order of 2-3 nanoseconds, the DLL/PLL 624 can be locked at a 200 MHz clock frequency, and phase adjustment can occur for each phase selection circuit 626 based on the N-bit control word 632 and phase signals 625. In some embodiments, N=5, but N can be any suitable value. For instance, if there are M=32 phase selection circuits, the outputs of these phase selection circuits 626 can be spaced at 360 degrees/32=11.25 degrees, so each phase selection circuit 626 has a phase offset of 11.25 degrees from other phase selection circuits. If the N-bit control word 623 is set to '0000', PWM0 can be selected and provide a phase of 0, while if N-bit control word 623 is set to '0001', PWM1 can be selected and provide a phase of 11.25 degrees, and so on. Multiple phase outputs can also be concurrently selected in some cases.

The illustrated DC-to-DC converter 604 is a phase shifted full bridge DC-to-DC converter that includes four switching transistors 628a, 628b, 628c, and 628d, a transformer 634, a rectifier 636, and an output filter 638. The switching transistors 628a, 628b, 628c, and 628d form a full-bridge on a primary side of the transformer 634. Transistors 628a and 628b are switched, for example at 50% duty cycle and 180 degrees out of phase with each other. Similarly, transistors 628c and 628d are switched at 50%) duty cycle and 180 degrees out of phase with each other. The modified PWM signals provided for transistors 628a and 628b are phase shifted by a phase offset with respect to the modified PWM signals provided for transistors 628c and 628d. The amount of this phase offset decides the amount of overlap between diagonal transistors, which in turn decides the amount of energy transferred from the voltage input Vin to the transformer 634. The rectifier 636 includes diodes on the secondary side of the transformer 634, and the output filter 638 filters the voltage output at the output 604o of the DC-to-DC converter 604. Thus, by changing the duty cycle and/or phase offset of the modified PWM signals, the pulse modulation circuit 602 can tune the voltage output provided by the DC-to-DC converter 604, relative to the voltage input. Typically, the higher the achievable switching frequency of the switching transistors 628a, 628b, 628c, and 628d, the better is the efficiency of conversion. Thus, in the context of high-resolution pulse width modulators, non-linearities such as asymmetries are potentially a larger problem, and alleviating the non-linearities by the disclosed techniques help to achieve the highest resolution possible from of the device.

The DC-to-DC converter 604 includes a third feedback path 607, which may also be referred to as a DC-to-DC feedback path in some embodiments, and a second feedback path 608. The third feedback path 607 couples the output 604o of the DC-to-DC converter to an error terminal of the pulse modulation circuit 602, and to an input of the timer module 622 in particular. An analog-to-digital converter (ADC) 640 and a microcontroller 642, which acts as a comparator, are arranged on the third feedback path 607. The ADC 640 converts the output voltage (Vout) to a digital value, and the microcontroller 642 compares this digital value to a digital target value, which can be a fixed/constant predetermined value or can change in time. The microcontroller 642 then generates an error signal 609 based on this comparison, and provides the error signal 609 to the timer module 622. The pulse modulation circuit 602 then changes the base PWM signal 630 based on the error signal 609, which in turn changes the modified PWM signals (e.g., 105) to control the output voltage provided by the DC-to-DC converter 604. For example, in most cases, the microcontroller (which can include application software), checks the output value of the ADC 640 and accordingly modifies control registers in the timer module 622 that in turn control the PWM output 630 and control word 632.

The second feedback path 608 couples the output of the first I/O pad 606a to the asymmetry detection circuit 614. The asymmetry detection circuit 614, which includes a phase-difference generation circuit 644 and a time-to-digital block or low-pass filter block 646, generates a control signal 107 to the DLL/PLL 624 based on whether the modified PWM signal 105 is asymmetric with regards to the clock signal 101 and/or PWM signal 103. Thus, the DLL/PLL 624 of FIG. 6 updates the PWM signal 103 of phase selection circuit 626a as well as the PWM signals of other phase selection circuits 626b-626m based on the control signal 107 to provide for highly controlled and accurate switching of the DC-to-DC converter 604.

In the example of FIG. 6, a single asymmetry detection circuit 614 is illustrated in the system, and provides its control signal 107 based on a single I/O pad 606a. This is advantageous because in many cases the I/O pads 606 are substantially identical to one another, and thus, having only a single asymmetry detection circuit provides an efficient solution. In particular, this approach provides a good balance in that takes into account asymmetry of the modified PWM signal 105 that arises due to the single I/O pad 606a (which is expected to be similar to that of the I/O pads 606b-606m), while still consuming a relatively small footprint on the die.

Figure 7:
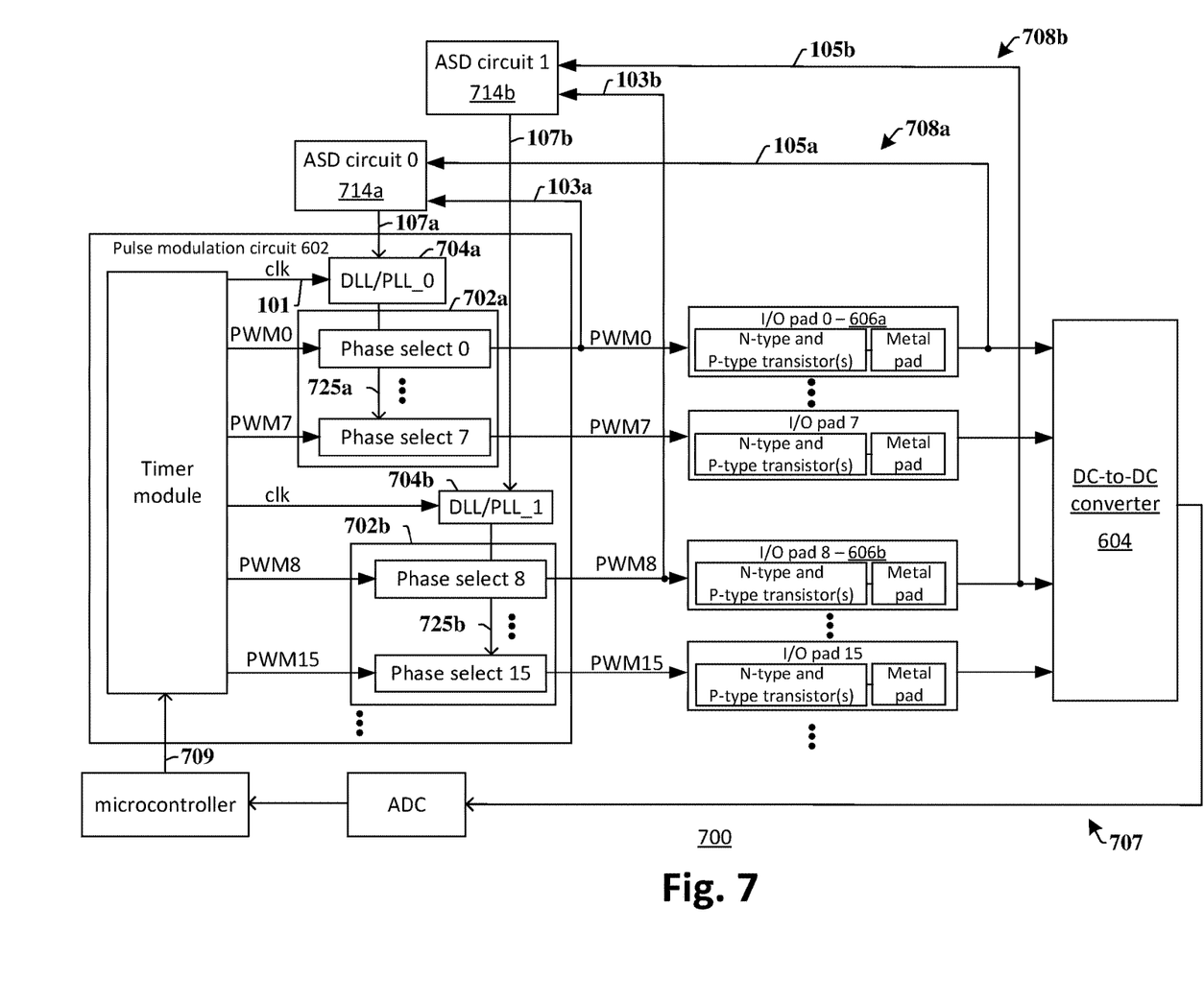
FIG. 7 illustrates another more detailed DC-to-DC converter system in accordance with some embodiments.

FIG. 7 shows another DC-to-DC converter system 700 where there are several sets of phase selection circuits, each of which is controlled by a corresponding DLL/PLL. For instance, a first set of phase selection circuits 702a is controlled by a first DLL/PLL 704a; and a second set of phase selection circuits 702b is controlled by a second DLL/PLL 704b. Additional sets of phase selection circuits and PLLs/DLLs can also be present—for example in some examples a total of twenty-four phase selection circuits divided into three sets of 8 phase selection circuits each can be included. Each DLL/PLL can be tuned by its own asymmetry detection circuit, wherein each asymmetry detection circuit monitors a different I/O pad by a corresponding feedback path (e.g., 708a, 708b). Thus, phase shift tuning can be individualized for each set of phase selection circuits. For example, first asymmetry detection circuit 714a can provide a first control signal 107a to the first DLL/PLL 704a based on a comparison between a first PWM signal 103a and a first modified PWM signal 105a, wherein this comparison can reflect a first phase shift due to the electrical characteristics of the first I/O pad 606a. The first control signal 107a provides phase shift tuning to the first DLL/PLL 704a, which is turn provides a first phase signal 725a to each of the phase selection circuit of the first set of phase selection circuits 702a to set their respective PWM signals (e.g., PWM0-PWM7). Similarly, second asymmetry detection circuit 714b can provide a second control signal 107b to the second DLL/PLL 704b based on a comparison between a second PWM signal 103b and a second modified PWM signal 105b, wherein this comparison can reflect a second phase shift due to the electrical characteristics of the second I/O pad 606b. The second control signal 107b provides phase shift tuning to the second DLL/PLL 704b, which is turn provides a second phase signal 725b to each of the phase selection circuit of the second set of phase selection circuits 702b to set their respective PWM signals (e.g., PWM8-PWM15). Thus, to the extent that some of the I/O pads may have different electrical characteristics, the various asymmetry detection circuits can provide separate control signals to individually tune the respective phase selection circuits. In some instances, for example the I/O pads can be far away from each other on the silicon (e.g., non-neighboring I/O pads) and hence these I/O pads can have different characteristics.

Figure 8:
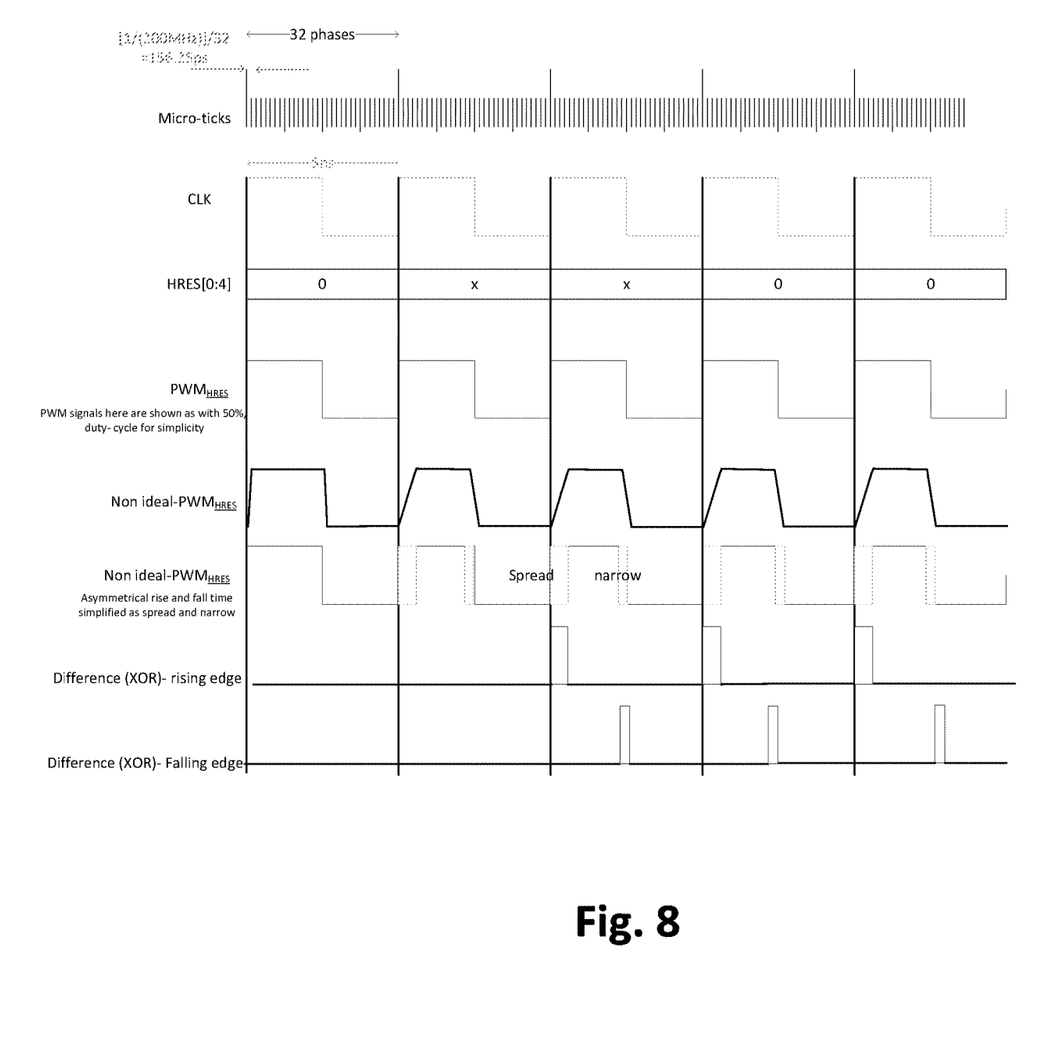
FIG. 8 illustrates some sample waveforms in accordance with some implementations consistent with FIG. 6 or FIG. 7.

FIG. 8 illustrates some sample waveforms that can correspond to FIG. 6 or FIG. 7. As shown in these waveforms, the rising edge signal and falling edge signal of the PWM signal are adjusted based on a control signal in the form of a rising edge difference signal and a falling edge difference signal. A phase signal (e.g., consistent with some example of phase signal 625 in FIG. 6) is also illustrated.

While the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below. The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

What is claimed is:

1. A system comprising:
   a pulse modulation circuit having a pulse modulation (PM) input and a PM output;
   a load circuit having a load circuit input;
   an I/O pad coupling the PM output to the load circuit input; and
   an asymmetry detection circuit having a first asymmetry detection (AD) input coupled to the PM output via a first feedback path, a second AD input coupled to an output node of the I/O pad via a second feedback path, and an AD output coupled to the PM input via a control path.

2. The system of claim 1, wherein the pulse modulation circuit is configured to provide a pulse width modulated (PWM) or pulse frequency modulated (PFM) signal to the load circuit input via the I/O pad, and the I/O pad is configured to provide a modified PWM or PFM signal to the load circuit input based on the PWM or PFM signal.

3. The system of claim 2, wherein the asymmetry detection circuit is configured to provide a control signal to the PM input via the control path, the control signal being indicative of an asymmetry between a rising edge duration of the modified PWM or PFM signal and a falling edge duration of the modified PWM or PFM signal during a first time interval, and being used to tune the PWM or PFM signal for a second time interval after the first time interval to limit the asymmetry.

4. The system of claim 2, wherein the asymmetry detection circuit is configured to provide a control signal to the PM input via the control path, the control signal being indicative of an asymmetry between the PWM or PFM signal and the modified PWM or PFM signal for a first time interval and being used to tune the PWM or PFM signal for a second time interval after the first time interval to limit the asymmetry.

5. The system of claim 4, wherein during the first time interval, the modified PWM or PFM signal has a rising edge that has a rising edge time difference relative to a corresponding rising edge of the PWM or PFM signal and has a falling edge that has a falling edge time difference relative to a corresponding falling edge of the PWM or PFM signal.

6. The system of claim 5, wherein the asymmetry detection circuit is configured to provide the control signal to the PM input to adjust the PWM or PFM signal so the rising edge time difference is equal to the falling edge time difference for the second time interval.

7. The system of claim 2, wherein the asymmetry detection circuit is configured to provide a control signal to the pulse modulation circuit to adjust the PWM or PFM signal, wherein the control signal is indicative of an asymmetry between: (1) a rising edge time difference between a rising edge of the PWM or PFM signal and a corresponding rising edge of the modified PWM or PFM signal and (2) a falling edge time difference between a falling edge of the PWM or PFM signal and a corresponding falling edge of the modified PWM or PFM signal.

8. The system of claim 7, wherein the asymmetry detection circuit is configured to generate a first signal representing the rising edge time difference and a second signal representing the falling edge time difference, to subtract the second signal from the first signal and pass the resulting subtracted signal through a low pass filter to the AD output.

9. The system of claim 7, wherein the load circuit is a DC-to-DC converter, the system further comprising:
a DC-to-DC feedback path coupling an output of the DC-to-DC converter to the pulse modulation circuit, wherein the pulse modulation circuit adjusts the PWM or PFM signal based on both the asymmetry between the rising edge time difference and the falling edge time difference and an error signal provided by the DC-to-DC feedback path.

10. The system of claim 7, wherein the I/O pad comprises a metal pad, and an n-type transistor and a p-type transistor coupled to the metal pad, wherein the PM output is coupled to the n-type transistor and the p-type transistor which are in turn coupled to the metal pad to define the output node of the I/O pad, the output node being coupled to the load circuit input.

11. An integrated circuit comprising:
a pulse modulation circuit having a pulse modulation (PM) output that is configured to provide a pulse width modulated (PWM) or pulse frequency modulated (PFM) signal;
an I/O pad including an I/O pad input and an I/O pad output, the I/O pad input coupled to the PM output and the I/O pad output configured to provide a modified PWM or PFM signal to a load circuit, the modified PWM or PFM signal based on the PWM or PFM signal; and
an asymmetry detection circuit having a first asymmetry detection (AD) input coupled to the PM output via a first feedback path, a second AD input coupled to I/O pad output via a second feedback path, and an AD output coupled to the pulse modulation circuit via a control path on which a control signal is provided to the pulse modulation circuit, the control signal being based on a difference between the first AD input and the second AD input and being operative to adjust the modified PWM or PFM signal.

12. The integrated circuit of claim 11, wherein the I/O pad comprises an n-type transistor and a p-type transistor coupled to a metal pad, the integrated circuit further comprising:
a bias adjust circuit having an input coupled to the AD output, the bias adjust circuit configured to adjust a current or voltage provided to the n-type transistor or the p-type transistor based on the control signal.

13. The integrated circuit of claim 11, wherein the pulse modulation circuit is configured to adjust a duty cycle or a rising edge or a falling edge of the PWM or PFM signal based on the control signal.

14. The integrated circuit of claim 13, wherein the asymmetry detection circuit is configured to determine an asymmetry between a first time corresponding to a rising edge of the PWM or PFM signal and a corresponding rising edge of a clock signal and a second time corresponding to a falling edge of the PWM or PFM signal and a corresponding falling edge of the clock signal, and to provide the control signal to adjust the PWM or PFM signal based on the asymmetry.

15. The integrated circuit of claim 11, wherein the load circuit is a DC-to-DC converter.

16. A method, comprising:
providing a PWM or PFM signal to an input of an I/O pad;
providing a modified PWM or PFM signal from an output of the I/O pad, the modified PWM or PFM signal based on the PWM or PFM signal; and
determining a control signal based on a difference between the PWM or PFM signal for one or more first clock cycles and the modified PWM or PFM signal for the one or more first clock cycles; and
adjusting the PWM or PFM signal for consecutive clock cycles after the one or more first clock cycles, wherein the adjusting is based on the control signal.

17. The method of claim 16, wherein the modified PWM or PFM signal is based on the PWM or PFM signal but has a rising edge or falling edge that has a time difference relative to a corresponding rising or falling edge of the PWM or PFM signal.

18. The method of claim 16, wherein the modified PWM or PFM signal is based on the PWM or PFM signal but has a rising edge that has a rising edge time difference relative to a corresponding rising edge of the PWM or PFM signal and has a falling edge that has a falling edge time difference relative to a corresponding falling edge of the PWM or PFM signal.

19. The method of claim 18, wherein the rising edge time difference differs from the falling edge time difference due to an asymmetry between a fall time of an n-type transistor of the I/O pad and a rise time of a p-type transistor of the I/O pad.

20. The method of claim 19, wherein the control signal is indicative of the rising edge time difference and the falling edge time difference, and the PWM or PFM signal is adjusted based on the control signal so the rising edge time difference is equal to the falling edge time difference for the consecutive clock cycles after the one or more first clock cycles.

* * * * *